United States Patent
McGrath

(10) Patent No.: US 7,062,401 B1
(45) Date of Patent: Jun. 13, 2006

(54) LOW CIRCUIT OVERHEAD BUILT IN SELF TEST FOR OVERSAMPLED ADC'S

(75) Inventor: Donald McGrath, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/032,776

(22) Filed: Jan. 11, 2005

(51) Int. Cl.
*H03M 1/10* (2006.01)

(52) U.S. Cl. .................. 702/117; 341/120; 341/155

(58) Field of Classification Search ............... None
See application file for complete search history.

(56) References Cited

U.S. PATENT DOCUMENTS

| | | | |
|---|---|---|---|
| 4,318,085 A * | 3/1982 | Whiteside et al. | 341/153 |
| 4,425,561 A * | 1/1984 | Whiteside et al. | 341/165 |
| 4,427,971 A * | 1/1984 | Whiteside et al. | 341/146 |
| 4,831,381 A * | 5/1989 | Hester | 341/172 |
| 5,319,370 A * | 6/1994 | Signore et al. | 341/120 |
| 5,389,926 A * | 2/1995 | Fukushima | 341/120 |
| 5,621,409 A * | 4/1997 | Cotter et al. | 341/156 |
| 5,852,415 A * | 12/1998 | Cotter et al. | 341/120 |
| 6,229,465 B1 * | 5/2001 | Bulaga et al. | 341/120 |
| 6,492,798 B1 * | 12/2002 | Sunter | 324/76.15 |
| 6,703,820 B1 * | 3/2004 | Sunter | 324/76.15 |
| 6,927,590 B1 * | 8/2005 | Iadanza | 324/763 |
| 2001/0013770 A1 * | 8/2001 | Wohlfarth | 324/73.1 |

\* cited by examiner

*Primary Examiner*—Carol S. W. Tsai
(74) *Attorney, Agent, or Firm*—Trexler, Bushnell, Giangiorgi, Blackstone & Marr, Ltd.

(57) ABSTRACT

Circuitry and a method for testing oversampled Analog to Digital converters. The voltage reference is used as the input signal, thus eliminating the need for a special signal generator. The dynamic signal is obtained by not sampling the voltage reference on every sample. Instead, a state machine is used to gate the sampling of the voltage reference, which in turn causes a varying amount of change to be injected into the first integrator in the converter. As a result, the state machine effectively simulates many input levels.

20 Claims, 3 Drawing Sheets

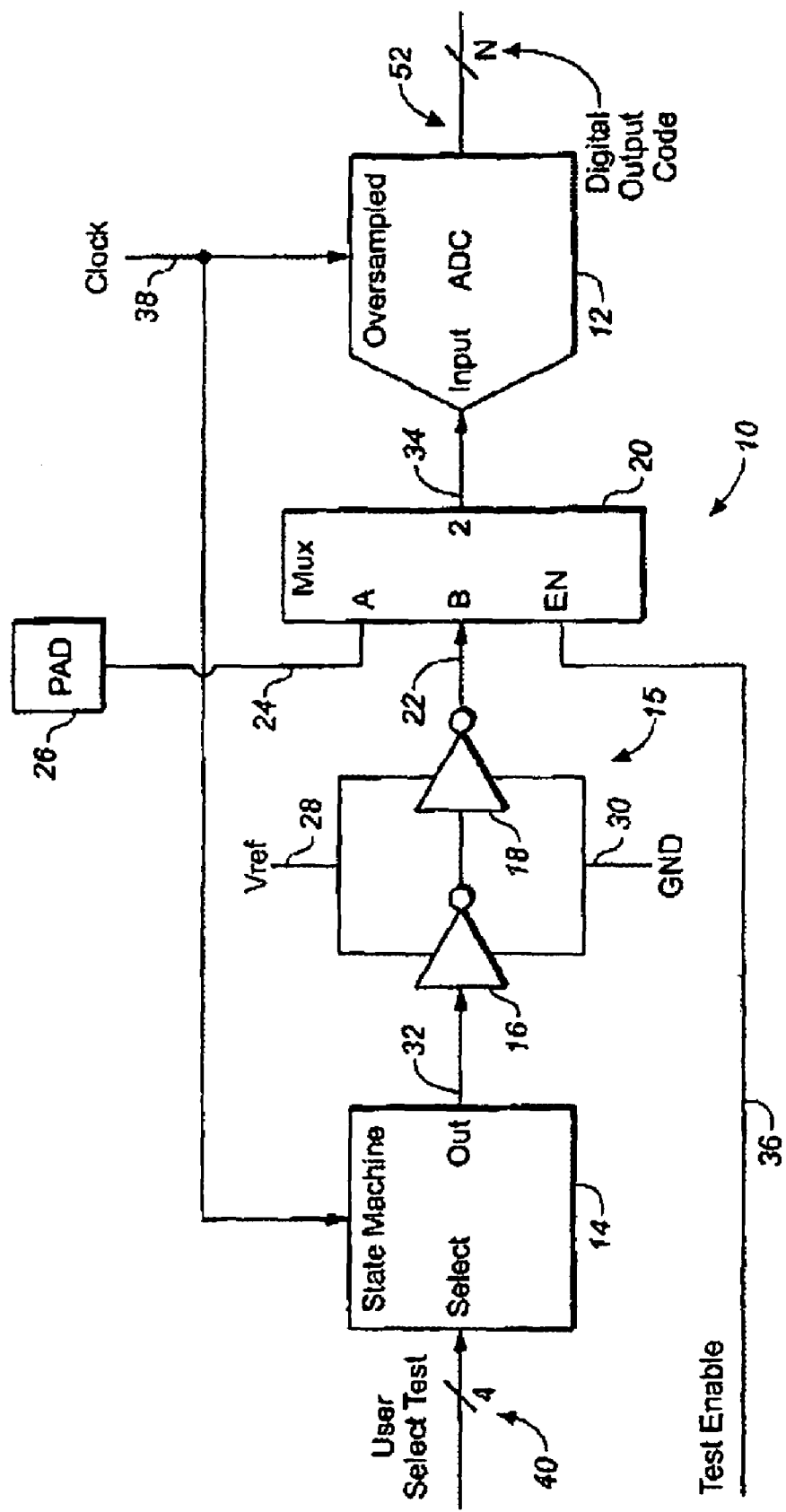
FIG._1

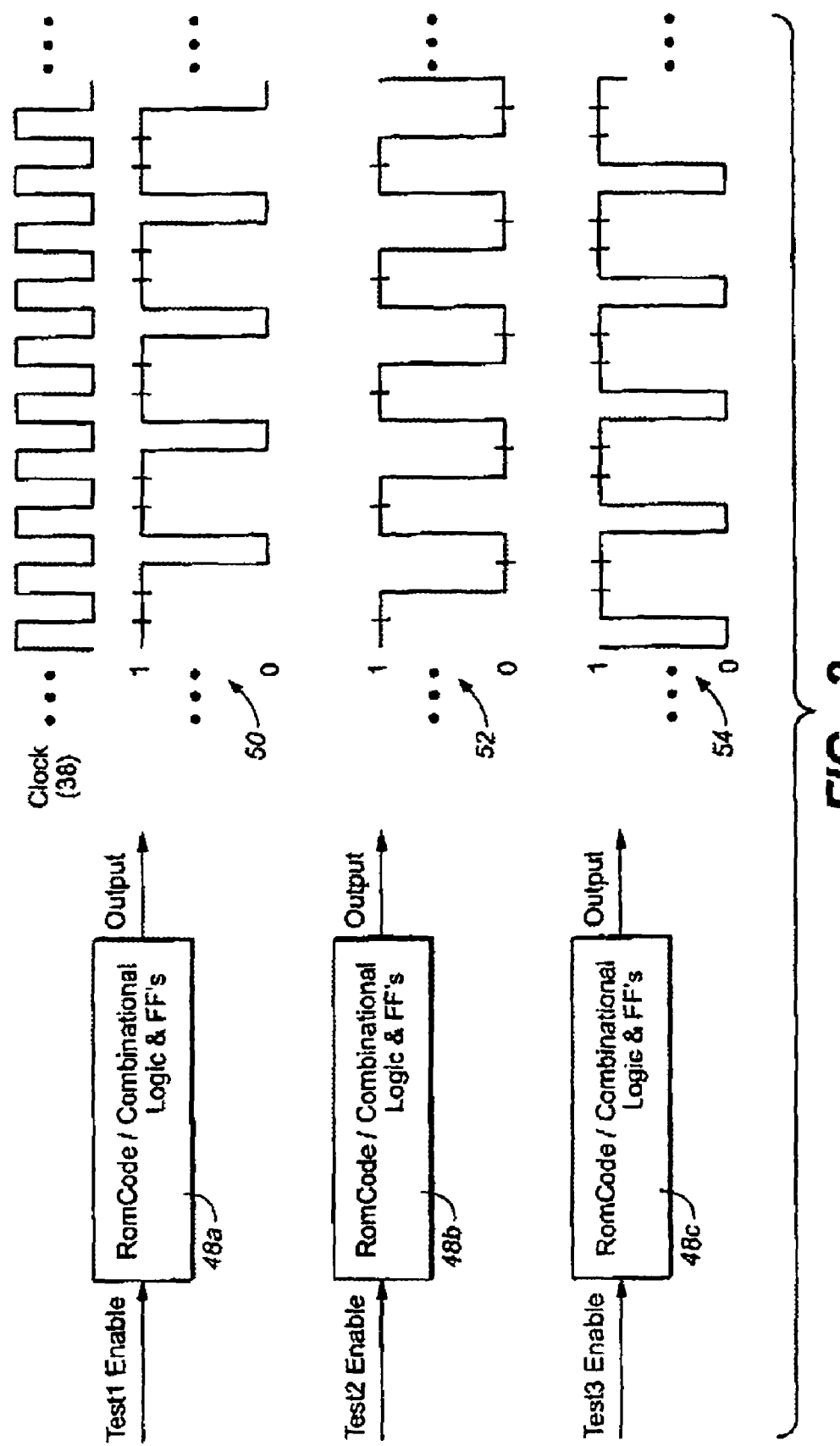
FIG._2

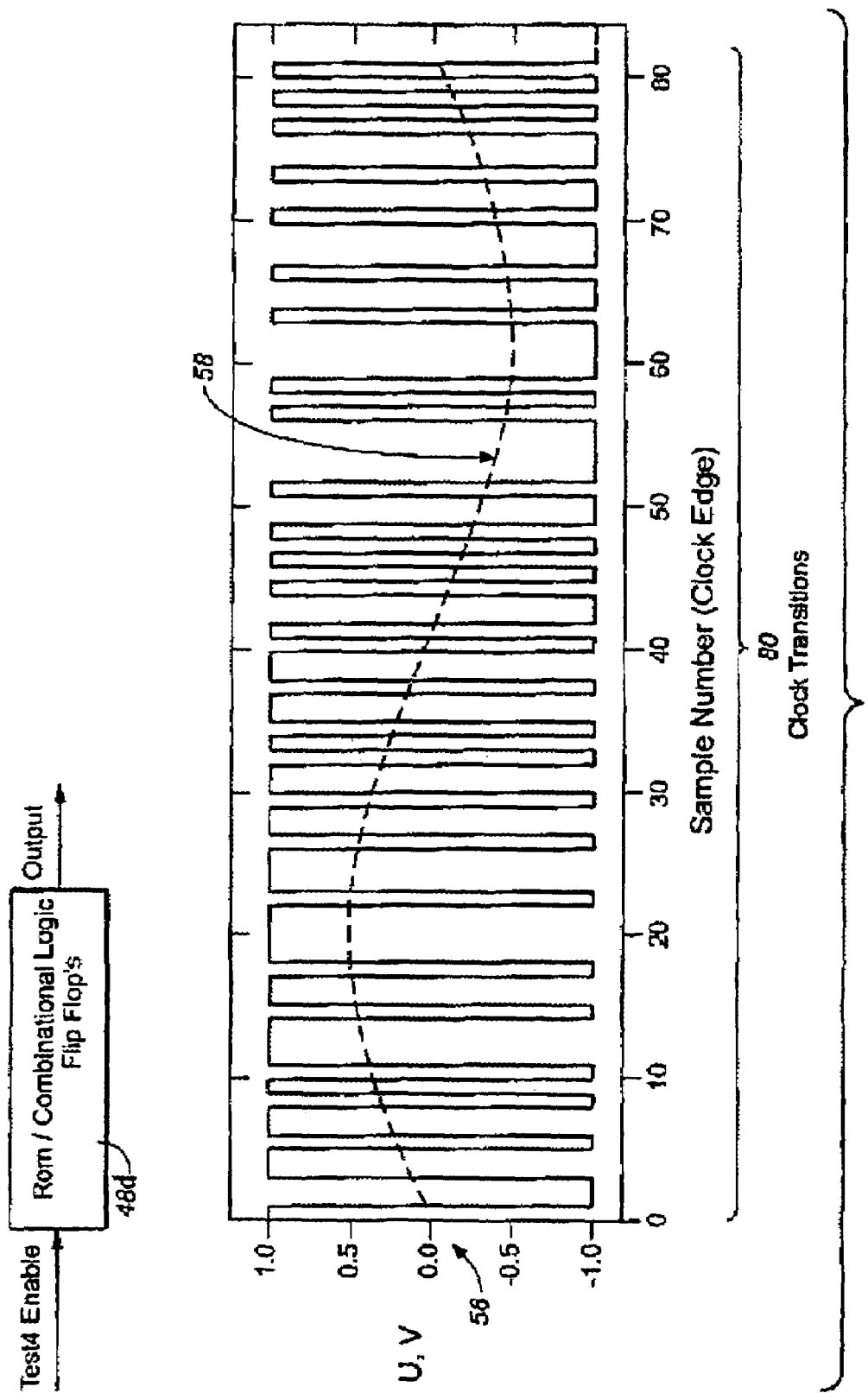
FIG._3

LOW CIRCUIT OVERHEAD BUILT IN SELF TEST FOR OVERSAMPLED ADC'S

BACKGROUND

The present invention generally relates to built in self tests for oversampled Analog to Digital converters, and more specifically relates to circuitry and a method for testing oversampled Analog to Digital converters using a state machine which simulates input levels.

Sigma delta or oversampled Analog to Digital converters sample their input signal at a high sample rate and output an averaged or low-passed filtered version of their input at a lower sample rate. Hence, for one output code of a sigma delta Analog to Digital Converter, many input samples are averaged together. The standard way to test an Analog to Digital converter is to sample a dynamic signal such as a ramp or sine wave to exercise the input signal range.

Testing Analog to Digital converters is especially important in platforms such as RapidChip, and typically requires special test hardware that adds cost to the final product. The hardware that is added typically includes a special test board and special instrumentation such as signal generators.

Some prior art methods employ on-chip signal generators. These add significant circuit overhead to the design. Prior art methods require a significant amount of additional circuitry in order to accomplish Built In Self Test.

OBJECTS AND SUMMARY

An object of an embodiment of the present invention is to provide circuitry and a method for testing oversampled Analog to Digital converters, where significant circuit overhead is not added to the design.

Another object of an embodiment of the present invention is to provide circuitry and a method for testing oversampled Analog to Digital converters, where a significant amount of additional circuitry need not be added in order to accomplish Built In Self Test.

Briefly, and in accordance with at least one of the foregoing objects, an embodiment of the present invention provides circuitry and a method for testing oversampled Analog to Digital converters, where the voltage reference is used as the input signal thus eliminating the need for a special signal generator. The dynamic signal is obtained by not sampling the voltage reference on every sample. A state machine is used to gate the sampling of the voltage reference, which in turn causes a varying amount of change to be injected into the first integrator in the converter. As a result, the state machine effectively simulates many input levels.

In a specific embodiment, a state machine is connected to two inverters, and the two inverters are connected to a multiplexer which is connected to the Analog to Digital converter. The multiplexer effectively allows a user to select the input into the Analog to Digital converter which is either the test input or normal operation input from a pad. The two inverters are connected to voltage reference and ground, and effectively act as a switch controllable by the state machine. If the output of the state machine is a 1 (high), then voltage reference is presented to the multiplexer and finally to the input of the Analog to Digital converter (assuming a test enable signal is active). On the other hand, if the output of the state machine is a 0 (low), then ground is presented to the multiplexer and finally to the input of the Analog to Digital converter (assuming the test enable signal is active). A clock signal is presented to both the state machine and the Analog to Digital converter, and a user select bus controls which test sequence the state machine outputs. Each of the test sequences is effectively a looping stream of 1's and 0's that are generated by, for example, either ROM code and/or combinational/flip flop logic. One of the test sequences may effectively emulate a sine wave being input to the Analog to Digital converter.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 1 illustrates circuitry, including a state machine, for testing an Analog to Digital converter, where the circuitry is in accordance with an embodiment of the present invention; and FIG. 2 illustrates some of the internal structure of the state machine shown in FIG. 1, as well as resulting signals associated with the structure; and FIG. 3 illustrates some more of the internal structure and associated signals of the state machine shown in FIG. 1, more specifically the structure and signals relating to a sine wave dynamic test.

DESCRIPTION

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

The present invention provides circuitry and a method for testing oversampled Analog to Digital converters. The voltage reference is used as the input signal, thus eliminating the need for a special signal generator. The dynamic signal is obtained by not sampling the voltage reference on every sample. Instead, a state machine is used to gate the sampling of the voltage reference, which in turn causes a varying amount of change to be injected into the first integrator in the converter. As a result, the state machine effectively simulates many input levels.

FIG. 1 illustrates a circuit 10 for testing an Analog to Digital converter 12. The circuit 10 includes a state machine 14, a switch 15, a multiplexer 20 and Analog to Digital converter. The multiplexer 20 allows the user to select the input into the Analog to Digital converter 12 which is either the test input 22 or normal operation input 24 from a pad 26.

In FIG. 1, the switch 15 is illustrated as comprising two inverters 16, 18. However, the switch can be provided as being some other structure, such as a transmission gate, etc. Regardless, the switch 15 is connected to voltage reference (Vref) 28 and ground 30, and is effectively controlled by the state machine 14. If the output 32 of the state machine 14 is a 1 (high) then Vref is presented to the multiplexer 20 and finally the input 34 to the Analog to Digital converter 12 (assuming the Test Enable signal 36 is high). If the output 32 of the state machine 14 is 0 (low), ground is presented to the multiplexer 20 and finally the input 34 to the Analog to Digital converter 12 (assuming the Test Enable signal 36 is high). A common clock 38 is presented to both the state machine 14 and the Analog to Digital converter 12. A user select bus controls which test sequence the state machine outputs via input 40. The tests will be explained next.

The state machine 14 includes a plurality of inputs 40 for selecting which test sequence to provide to the inverters. In the example shown, the state machine has four inputs (Test 1 Enable, Test 2 Enable, Test 3 Enable and Test 4 Enable as indicated in FIGS. 2 and 3) for selecting between four tests. The tests are essentially a looping stream of 1's and 0's that are generated by either rom code and/or combinational/flip flop logic 48a, 48b, 48c, 48d.

FIG. 2 illustrates three of the four test sequences (i.e., the structure and signals associated with tests 1 through 3). Test 1 is a streaming code 50 that is composed of three 1's followed by a single 0 that repeats. As described above, the sigma delta Analog to Digital converter 12 averages many input samples to create a single output sample (digital output code) 52. If we average three 1's which inputs 3 values of Vref and a 0 which inputs a zero into the Analog to Digital converter, we get ((Vref+Vref+Vref+0)/4=0.75Vref). Similarly, Test 2 is a streaming code 52 that is composed of two 1's followed by two 0's for (Vref+Vref+0+0)/4=0.5Vref. Test 3 is a streaming code 54 that is composed of a single 1 followed by three 0's for (Vref+0+0+0)/4=0.25Vref). Hence, the Analog to Digital converter input codes associated with tests 1 through 3 represent 0.75Vref, 0.5Vref, and 0.25Vref, respectively. It should be understood that the switch 15 only switches to ground or Vref. The averaging inside the Analog to Digital converter 12 itself emulates a fraction of the voltage reference.

FIG. 3 illustrates the structure and signals associated with a dynamic test which provides a repeating sequence 56 that emulates a sine wave 58. The number of input samples is on the bottom axis (80 clock transitions). As shown, this test pattern is much longer than that of tests 1 through 3. The analog representation of the output code is a sine wave 58 effectively in the middle of the 0, 1 sequence. When the sine wave is high, most of the input samples are 1's. On the other hand, when the sine wave is low, most of the input samples are low.

Clearly the patterns shown in FIGS. 2 and 3 are illustrative examples for demonstration purposes only. For example, FIG. 3 illustrates a dynamic test which emulates a sine wave. Instead, the dynamic test can be configured to emulate a triangular wave, a combination of sine waves, or some other type of wave(s). Alternatively, the Analog to Digital converter 12 can be tested using only DC tests, such as those shown in FIG. 2. The exact sequence of the 1's and 0's will be dependant upon the Over Sample Ratio of the particular Analog to Digital converter and the converter's Noise Transfer Function. However, these simple examples illustrate the spirit of the intended invention.

While embodiments of the present invention are shown and described, it is envisioned that those skilled in the art may devise various modifications of the present invention without departing from the spirit and scope of the appended claims. For example, the methodology described herein can be used not only for pattern generation purposes but also for fault grading purposes.

What is claimed is:

1. A circuit for testing an Analog to Digital converter, said circuit comprising: a state machine configured to generate test sequences comprising a combination of high and low signals, a multiplexer connected to an input of said Analog to Digital converter, a switch connected to voltage reference, ground, an output of said state machine, and a input of said multiplexer, said switch configured to receive said test sequences from said state machine and selectively provide voltage reference and ground signals to the multiplexer depending on the test sequence generated by the state machine, wherein the multiplexer is configured to selectively provide the voltage and ground signals to the Analog to Digital converter.

2. A circuit as recited in claim 1, wherein said switch comprises a plurality of inverters, wherein the output of said state machine is connected to at least one of said inverters.

3. A circuit as recited in claim 2, wherein said inverters are connected to voltage reference and ground and are configured to switch between voltage reference and ground depending on the output of said state machine.

4. A circuit as recited in claim 1, wherein a clock signal is provided to said state machine and said Analog to Digital converter.

5. A circuit as recited in claim 1, wherein an input pad is connected to an input of said multiplexer for providing normal operation input.

6. A circuit as recited in claim 1, wherein the state machine includes a plurality of inputs for selecting which test sequence to provide to said switch.

7. A circuit as recited in claim 6, wherein at least one of the test sequences is dynamic and emulates at least one of a sine wave, a triangular wave and a combination of sine waves.

8. A circuit as recited in claim 6, wherein the output of said state machine is connected to said switch, wherein said switch is connected to voltage reference and ground and is configured to switch between voltage reference and ground depending on the output of said state machine, wherein a plurality of the test sequences which are generated by the state machine are configured to provide that voltage reference and ground are selectively provided to said Analog to Digital converter such that said Analog to Digital converter emulates a fraction of the voltage reference.

9. A method for testing an Analog to Digital converter, said method comprising having a state machine generate test sequences comprising a combination of high and low signal and a multiplexer connected to an input of said Analog to Digital converter and provide said test sequences to a switch which is connected to voltage reference, ground, an output of said state machine, and an input of said multiplexer, said switch configured to receive said test sequences from said state machine and to selectively provide voltage reference and ground signals to the multiplexer depending on the test sequence generated by the state machine, wherein the multiplexer is configured to selectively provide the voltage reference and ground signals to the Analog to Digital converter.

10. A method as recited in claim 9, further comprising providing that said switch comprises a plurality of inverters, wherein the output of said state machine is connected to at least one of said inverters.

11. A method as recited in claim 10, further comprising providing a voltage reference and ground to said inverters such that the inverters switch between voltage reference and ground depending on the output of said state machine.

12. A method as recited in claim 9, further comprising providing a clock signal to said state machine and said Analog to Digital converter.

13. A method as recited in claim 9, further comprising providing an input pad connected to an input of said multiplexer for providing normal operation input.

14. A method as recited in claim 9, further comprising providing that the state machine includes a plurality of inputs for selecting which test sequence to provide to said switch.

15. A method as recited in claim 14, further comprising providing that at least one of the test sequences is dynamic and emulates at least one of a sine wave, a triangular wave and a combination of sine waves, emulates a sine wave.

16. A method as recited in claim 14, further comprising providing that said switch comprises a plurality of inverters, wherein the output of said state machine is connected to at least one of said inverters, wherein said inverters are connected to voltage reference and ground and are configured to switch between voltage reference and ground depending on the output of said state machine, wherein a plurality of the test sequences which are generated by the state machine are configured to provide that voltage reference and ground are selectively provided to said Analog to Digital converter such that said Analog to Digital converter emulates a fraction of the voltage reference.

17. A circuit for testing an Analog to Digital converter, said circuit comprising: a state machine configured to generate test sequences comprising a combination of high and low signals, a switch connected to voltage reference, ground and an output of said state machine, said switch configured to receive said test sequences from said state machine, wherein the circuit is configured to selectively provide voltage reference and ground signals to the Analog to Digital converter depending on the test sequence generated by the state machine; further comprising a multiplexer connected to an input of said Analog to Digital converter, and an input pad connected to an input of said multiplexer for providing normal operation input.

18. A circuit as recited in claim 17, wherein the state machine includes a plurality of inputs for selecting which test sequence to provide to said switch.

19. A circuit as recited in claim 17, wherein at least one of the test sequences is dynamic and emulates at least one of a sine wave, a triangular wave and a combination of sine waves.

20. A circuit as recited in claim 18, wherein the output of said state machine is connected to said switch, wherein said switch is connected to voltage reference and ground and is configured to switch between voltage reference and ground depending on the output of said state machine, wherein a plurality of the test sequences which are generated by the state machine are configured to provide that voltage reference and ground are selectively provided to said Analog to Digital converter such that said Analog to Digital converter emulates a fraction of the voltage reference.

* * * * *